(12) United States Patent
Lee

(10) Patent No.: US 12,324,335 B2
(45) Date of Patent: *Jun. 3, 2025

(54) PIXEL ARRANGEMENT STRUCTURE FOR ORGANIC LIGHT EMITTING DISPLAY DEVICE

(71) Applicant: SAMSUNG DISPLAY CO., LTD., Yongin-si (KR)

(72) Inventor: Sang-Shin Lee, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 18/443,230

(22) Filed: Feb. 15, 2024

(65) Prior Publication Data

US 2024/0196686 A1    Jun. 13, 2024

Related U.S. Application Data

(63) Continuation of application No. 18/175,351, filed on Feb. 27, 2023, now Pat. No. 11,980,077, which is a continuation of application No. 16/505,536, filed on Jul. 8, 2019, now Pat. No. 11,594,578, which is a continuation of application No. 15/811,599, filed on Nov. 13, 2017, now Pat. No. 10,854,683, which is a
(Continued)

(30) Foreign Application Priority Data

Mar. 6, 2012 (KR) .................. 10-2012-0022967

(51) Int. Cl.
*H10K 59/35*     (2023.01)

(52) U.S. Cl.
CPC ......... *H10K 59/352* (2023.02); *H10K 59/353* (2023.02)

(58) Field of Classification Search
CPC .......................... H10K 59/352; H10K 59/353
See application file for complete search history.

(56) References Cited

U.S. PATENT DOCUMENTS

| | | |
|---|---|---|
| 3,971,065 A | 7/1976 | Bayer |
| 4,491,863 A | 1/1985 | Kurahashi |
| 4,642,619 A | 2/1987 | Togashi |

(Continued)

FOREIGN PATENT DOCUMENTS

| | | |
|---|---|---|
| CN | 1726593 A | 1/2006 |
| CN | 1874000 A | 12/2006 |

(Continued)

OTHER PUBLICATIONS

U.S. Notice of Allowance from U.S. Appl. No. 17/396,582, dated Mar. 1, 2024, 8 pages.

(Continued)

*Primary Examiner* — Kwang-Su Yang
(74) *Attorney, Agent, or Firm* — Womble Bond Dickinson (US) LLP

(57) ABSTRACT

A pixel arrangement structure of an OLED display is provided. The pixel arrangement structure includes: a first pixel having a center coinciding with a center of a virtual square; a second pixel separated from the first pixel and having a center at a first vertex of the virtual square; and a third pixel separated from the first pixel and the second pixel, and having a center at a second vertex neighboring the first vertex of the virtual square.

26 Claims, 5 Drawing Sheets

Related U.S. Application Data continuation of application No. 13/614,197, filed on Sep. 13, 2012, now Pat. No. 9,818,803.

(56) References Cited

U.S. PATENT DOCUMENTS

| | | |
|---|---|---|
| 4,965,565 A | 10/1990 | Noguchi |
| 5,113,274 A | 5/1992 | Takahashi et al. |
| 5,142,392 A | 8/1992 | Ueki et al. |
| 5,461,503 A | 10/1995 | Deffontaines et al. |
| 5,485,293 A | 1/1996 | Robinder |
| 5,742,129 A | 4/1998 | Nagayama et al. |
| 6,078,371 A | 6/2000 | Ichikawa et al. |
| 6,198,507 B1 | 3/2001 | Ishigami |
| 6,326,981 B1 | 12/2001 | Mori et al. |
| 6,366,025 B1 | 4/2002 | Yamada |
| 6,552,706 B1 | 4/2003 | Ikeda et al. |
| 6,747,618 B2 | 6/2004 | Arnold et al. |
| 6,838,819 B2 | 1/2005 | Kim et al. |
| 6,867,549 B2 | 3/2005 | Cok et al. |
| 6,882,364 B1 | 4/2005 | Inuiya et al. |
| 6,897,855 B1 | 5/2005 | Matthies et al. |
| 6,933,976 B1 | 8/2005 | Suzuki |
| 6,950,115 B2 | 9/2005 | Brown Elliott |
| 7,075,242 B2 | 7/2006 | Miller et al. |
| 7,091,986 B2 | 8/2006 | Phan |
| 7,110,031 B2 | 9/2006 | Kondo et al. |
| 7,126,272 B2 | 10/2006 | Matsumoto |
| 7,184,067 B2 | 2/2007 | Miller et al. |
| 7,187,425 B2 | 3/2007 | Yamazaki |
| 7,215,347 B2 | 5/2007 | Phan |
| 7,230,594 B2 | 6/2007 | Miller et al. |
| 7,250,722 B2 | 7/2007 | Cok et al. |
| 7,274,383 B1 | 9/2007 | Brown Elliot |
| 7,291,970 B2 | 11/2007 | Kuwabara |
| 7,301,273 B2 | 11/2007 | Dedene et al. |
| 7,397,485 B2 | 7/2008 | Miller et al. |
| 7,515,122 B2 | 4/2009 | Miller et al. |
| 7,612,811 B2 | 11/2009 | Takeushi et al. |
| 7,646,430 B2 | 1/2010 | Brown Elliott et al. |
| 7,710,484 B2 | 5/2010 | Oda |
| 7,755,652 B2 | 7/2010 | Credelle et al. |
| 7,982,786 B2 | 7/2011 | Nishida et al. |
| 7,986,089 B2 | 7/2011 | Kitabayashi |
| 8,026,669 B2 | 9/2011 | Kawasaki et al. |
| 8,026,869 B2 | 9/2011 | Takagi et al. |
| 8,118,633 B2 | 2/2012 | Yuasa |
| 8,134,583 B2 | 3/2012 | Credelle |
| 8,159,511 B2 | 4/2012 | Brown Elliott et al. |
| 8,223,168 B2 | 7/2012 | Brown Elliott et al. |
| 8,294,741 B2 | 10/2012 | Brown Elliott et al. |
| 8,330,152 B2 | 12/2012 | So |
| 8,330,352 B2 | 12/2012 | Sung et al. |
| 8,334,859 B2 | 12/2012 | Liu et al. |
| 8,350,468 B2 | 1/2013 | Ko et al. |
| 8,354,789 B2 | 1/2013 | Kim et al. |
| 8,363,072 B2 | 1/2013 | Hong et al. |
| 8,395,157 B2 | 3/2013 | Park et al. |
| 8,395,571 B2 | 3/2013 | Kim et al. |
| 8,405,692 B2 | 3/2013 | Brown Elliott et al. |
| 8,421,820 B2 | 4/2013 | Brown Elliott et al. |
| 8,456,496 B2 | 6/2013 | Credelle |
| 8,519,910 B2 | 8/2013 | Park et al. |
| 8,519,917 B2 | 8/2013 | Ryu et al. |
| 8,552,635 B2 | 10/2013 | Kim et al. |
| 8,558,222 B2 | 10/2013 | Hwang et al. |
| 8,587,003 B2 | 11/2013 | Ando |
| 8,754,913 B2 | 6/2014 | Hwang et al. |
| 8,830,275 B2 | 9/2014 | Higgins |
| 8,833,294 B2 | 9/2014 | Lee et al. |
| 8,853,016 B2 | 10/2014 | Park et al. |
| 8,866,707 B2 | 10/2014 | Koyama et al. |
| 8,883,532 B2 | 11/2014 | Ando |
| 8,934,034 B2 | 1/2015 | Nayar et al. |
| 9,041,625 B2 | 5/2015 | Hwang et al. |
| 9,305,487 B2 | 4/2016 | Yang et al. |
| 9,355,601 B2 | 5/2016 | Brown Elliott |
| 9,398,205 B2 | 7/2016 | Côté et al. |
| 9,431,469 B2 | 8/2016 | Park et al. |
| 9,837,476 B2 | 12/2017 | Park et al. |
| 10,403,211 B2 | 9/2019 | Hai et al. |
| 10,854,683 B2 | 12/2020 | Lee |
| 11,594,578 B2 | 2/2023 | Lee |
| 2002/0015110 A1 | 2/2002 | Brown Elliott |
| 2002/0070909 A1 | 6/2002 | Asano et al. |
| 2002/0113195 A1 | 8/2002 | Osada |
| 2002/0140833 A1 | 10/2002 | Hirai |
| 2003/0076454 A1 | 4/2003 | Burroughes |
| 2003/0117423 A1 | 6/2003 | Brown-Elliott et al. |
| 2003/0128179 A1 | 7/2003 | Credelle |
| 2003/0128225 A1 | 7/2003 | Credelle et al. |
| 2003/0218618 A1 | 11/2003 | Phan |
| 2004/0036421 A1 | 2/2004 | Arnold et al. |
| 2004/0046714 A1 | 3/2004 | Brown Elliott |
| 2004/0108818 A1 | 6/2004 | Cok et al. |
| 2004/0113875 A1 | 6/2004 | Miller et al. |
| 2004/0150651 A1 | 8/2004 | Phan |
| 2004/0183764 A1 | 9/2004 | Kim et al. |
| 2004/0246426 A1 | 12/2004 | Wang et al. |
| 2005/0001542 A1 | 1/2005 | Kiguchi |
| 2005/0116615 A1 | 6/2005 | Matsumoto et al. |
| 2005/0162079 A1 | 7/2005 | Sakamoto |
| 2005/0225575 A1 | 10/2005 | Elliott et al. |
| 2005/0270444 A1 | 12/2005 | Miller et al. |
| 2006/0119738 A1 | 6/2006 | Kido |
| 2006/0152531 A1 | 7/2006 | Lin et al. |
| 2006/0274090 A1 | 12/2006 | Koyama et al. |
| 2007/0164335 A1 | 7/2007 | McKee |
| 2007/0230818 A1 | 10/2007 | Messing et al. |
| 2008/0001525 A1 | 1/2008 | Chao et al. |
| 2008/0001527 A1 | 1/2008 | Koo et al. |
| 2008/0018765 A1 | 1/2008 | Choi et al. |
| 2008/0231554 A1 | 9/2008 | Lee |
| 2008/0273793 A1 | 11/2008 | Oishi |
| 2008/0308819 A1 | 12/2008 | Louwsma et al. |
| 2009/0027377 A1 | 1/2009 | Kwon |
| 2009/0194780 A1 | 8/2009 | Kwon |
| 2009/0244101 A1 | 10/2009 | Langendijk et al. |
| 2009/0302331 A1 | 12/2009 | Smith et al. |
| 2009/0321727 A1 | 12/2009 | Yutani et al. |
| 2010/0033084 A1 | 2/2010 | Ko et al. |
| 2010/0045695 A1 | 2/2010 | Brown Elliott et al. |
| 2010/0117528 A1 | 5/2010 | Fukuda |
| 2010/0117936 A1 | 5/2010 | Lhee et al. |
| 2010/0133994 A1 | 6/2010 | Song et al. |
| 2010/0171440 A1 | 7/2010 | Satou et al. |
| 2010/0253608 A1 | 10/2010 | Kim et al. |
| 2010/0315318 A1 | 12/2010 | Lee et al. |
| 2011/0012820 A1 | 1/2011 | Kim et al. |
| 2011/0018858 A1 | 1/2011 | Ryu et al. |
| 2011/0084955 A1 | 4/2011 | Kim |
| 2011/0115772 A1 | 5/2011 | Chung |
| 2011/0147770 A1 | 6/2011 | Hwang et al. |
| 2011/0177640 A1 | 7/2011 | Han et al. |
| 2011/0211099 A1 | 9/2011 | Nayar et al. |
| 2011/0215302 A1 | 9/2011 | Lhee et al. |
| 2011/0216056 A1 | 9/2011 | Yoo et al. |
| 2011/0260951 A1 | 10/2011 | Hwang et al. |
| 2011/0291549 A1 | 12/2011 | Kim et al. |
| 2011/0291550 A1 | 12/2011 | Kim et al. |
| 2011/0298836 A1 | 12/2011 | Komiya et al. |
| 2011/0316892 A1 | 12/2011 | Sung et al. |
| 2012/0028390 A1 | 2/2012 | Lee et al. |
| 2012/0049726 A1 | 3/2012 | Yoo et al. |
| 2012/0056531 A1 | 3/2012 | Park et al. |
| 2012/0086330 A1 | 4/2012 | Umeda et al. |
| 2012/0092238 A1 | 4/2012 | Hwang et al. |
| 2012/0176298 A1 | 7/2012 | Suh et al. |
| 2012/0287605 A1 | 11/2012 | Chen et al. |
| 2012/0313844 A1 | 12/2012 | Im et al. |
| 2012/0319564 A1 | 12/2012 | Ghosh et al. |
| 2013/0002911 A1 | 1/2013 | Miyashita et al. |
| 2013/0037827 A1 | 2/2013 | Levermore et al. |
| 2013/0057521 A1 | 3/2013 | Kim |
| 2013/0106891 A1 | 5/2013 | Matsueda et al. |

(56) References Cited

U.S. PATENT DOCUMENTS

| | | |
|---|---|---|
| 2013/0127689 A1 | 5/2013 | Gollier |
| 2014/0191202 A1 | 7/2014 | Shim et al. |
| 2015/0070562 A1 | 3/2015 | Nayar et al. |
| 2015/0187273 A1 | 7/2015 | Chang et al. |
| 2015/0192834 A1 | 7/2015 | Morinaga et al. |
| 2016/0124557 A1 | 5/2016 | Choi |
| 2016/0171930 A1 | 6/2016 | Song et al. |
| 2016/0190166 A1 | 6/2016 | Kim et al. |
| 2019/0333970 A1 | 10/2019 | Lee |
| 2020/0394955 A1 | 12/2020 | Lee |
| 2022/0319406 A1 | 10/2022 | Lee |
| 2023/0245620 A1 | 8/2023 | Lee |

FOREIGN PATENT DOCUMENTS

| | | |
|---|---|---|
| CN | 1889271 A | 1/2007 |
| CN | 101009304 A | 8/2007 |
| CN | 101211518 A | 7/2008 |
| CN | 100439989 C | 12/2008 |
| CN | 100448020 C | 12/2008 |
| CN | 101449382 A | 6/2009 |
| CN | 102054435 A | 5/2011 |
| CN | 102354479 A | 2/2012 |
| CN | 103311266 A | 9/2013 |
| CN | 203260586 U | 10/2013 |
| CN | 105206647 A | 12/2015 |
| EP | 0 322 106 A2 | 6/1989 |
| EP | 1168448 A2 | 1/2002 |
| EP | 1450408 A2 | 8/2004 |
| EP | 2 637 209 A1 | 9/2013 |
| GB | 2 437 110 A | 10/2007 |
| JP | 02-000826 A | 1/1990 |
| JP | 03-078390 A | 4/1991 |
| JP | 3-36239 | 5/1991 |
| JP | 8-227276 A | 9/1996 |
| JP | 08-335060 A | 12/1996 |
| JP | 09-182091 A | 7/1997 |
| JP | 10-39791 | 2/1998 |
| JP | 2000-180837 A | 6/2000 |
| JP | 2000-235891 | 8/2000 |
| JP | 2001-33757 A | 2/2001 |
| JP | 2001-54127 A | 2/2001 |
| JP | 2001-76881 A | 3/2001 |
| JP | 3203907 B2 | 9/2001 |
| JP | 2001-290441 A | 10/2001 |
| JP | 2003-203770 A | 7/2003 |
| JP | 2004-507773 | 3/2004 |
| JP | 2004-179028 A | 6/2004 |
| JP | 2004-192813 | 7/2004 |
| JP | 2005-5227 A | 1/2005 |
| JP | 2005-62416 | 3/2005 |
| JP | 2005-63787 A | 3/2005 |
| JP | 2005-515505 A | 5/2005 |
| JP | 2005-352140 | 12/2005 |
| JP | 4496852 B2 | 12/2005 |
| JP | 2006-18195 A | 1/2006 |
| JP | 2006-163316 A | 6/2006 |
| JP | 2006-309182 | 11/2006 |
| JP | 2007-156126 A | 6/2007 |
| JP | 2008-015521 | 1/2008 |
| JP | 2008-502004 A | 1/2008 |
| JP | 2008-277264 A | 11/2008 |
| JP | 2008-298966 A | 12/2008 |
| JP | 2008-300367 A | 12/2008 |
| JP | 2009-48851 A | 3/2009 |
| JP | 4278353 B2 | 6/2009 |
| JP | 2009-182320 A | 8/2009 |
| JP | 2009-230096 A | 10/2009 |
| JP | 2009-250994 A | 10/2009 |
| JP | 2010-3880 A | 1/2010 |
| JP | 2010-153173 A | 7/2010 |
| JP | 2011-076760 | 4/2011 |
| JP | 2011-198761 A | 10/2011 |
| JP | 2011-528866 A | 11/2011 |
| JP | 2012-15129 A | 1/2012 |
| JP | 2012-19206 A | 1/2012 |
| JP | 2012-028170 A | 2/2012 |
| JP | 2012-79631 A | 4/2012 |
| JP | 5177957 B2 | 4/2013 |
| JP | 2022-046648 A | 3/2022 |
| KR | 10-2004-0096706 A | 11/2004 |
| KR | 10-2006-0118868 A | 11/2006 |
| KR | 10-0742370 B1 | 7/2007 |
| KR | 10-0807524 B1 | 2/2008 |
| KR | 10-2008-0020320 A | 3/2008 |
| KR | 10-2008-0111130 | 12/2008 |
| KR | 10-2009-0017910 A | 2/2009 |
| KR | 10-2009-0049515 A | 5/2009 |
| KR | 10-1015332 B1 | 2/2011 |
| KR | 10-2011-0023996 A | 3/2011 |
| KR | 10-2011-0030954 A | 3/2011 |
| KR | 10-2011-0039773 A | 4/2011 |
| KR | 10-2011-0071446 A | 6/2011 |
| KR | 10-1056258 B1 | 8/2011 |
| KR | 10-2011-0106565 A | 9/2011 |
| KR | 10-2011-0108049 A | 10/2011 |
| KR | 10-2011-0108050 A | 10/2011 |
| KR | 10-2011-0117613 A | 10/2011 |
| KR | 10-2011-0129531 | 12/2011 |
| KR | 10-2012-0000887 A | 1/2012 |
| KR | 10-2012-0012300 A | 2/2012 |
| KR | 10-2012-0014074 A | 2/2012 |
| KR | 10-2012-0022967 A | 3/2012 |
| KR | 10-1332495 B1 | 11/2013 |
| KR | 10-2020-0000840 A | 1/2020 |
| KR | 102585302 B1 | 10/2023 |
| TW | 200305126 A | 10/2003 |
| TW | I277930 B | 4/2007 |
| TW | I328207 | 8/2010 |
| WO | WO 03/053068 A2 | 6/2003 |
| WO | WO 03/060870 A1 | 7/2003 |
| WO | WO 2004/073356 A1 | 8/2004 |
| WO | WO 2005/067352 A1 | 7/2005 |

OTHER PUBLICATIONS

U.S. Notice of Allowance from U.S. Appl. No. 18/296,330, dated Feb. 7, 2024, 8 pages.
U.S. Office Action for U.S. Appl. No. 17/396,613, dated Feb. 15, 2024, 38 pages.
U.S. Office Action dated Sep. 19, 2022, issued in U.S. Appl. No. 17/808,985 (25 pages).
U.S. Office Action dated Oct. 14, 2022, issued in U.S. Appl. No. 17/808,982 (25 pages).
U.S. Office Action dated Oct. 14, 2022, issued in U.S. Appl. No. 17/808,983 (23 pages).
U.S. Notice of Allowance dated Dec. 23, 2022, issued in U.S. Appl. No. 16/505,536 (9 pages).
U.S. Office Action dated Jan. 4, 2023, issued in U.S. Appl. No. 17/808,985 (27 pages).
U.S. Office Action dated Nov. 3, 2022, issued in U.S. Appl. No. 17/808,984 (25 pages).
U.S. Office Action dated Nov. 10, 2022, issued in U.S. Appl. No. 17/865,304 (23 pages).
Chinese Office Action dated Sep. 13, 2022, issued in Chinese Patent Application No. 201910040602.2 (9 pages).
Decision by the Intellectual Property Trial and Appeal Board (IPTAB) of the Korean Intellectual Property Office (KIPO) on Patent Cancellation Request of Korean Patent No. KR 2115531 (corresponding to U.S. Pat. No. 9,818,803) dated Mar. 16, 2021, 12 pages.
English translation of Decision by the Intellectual Property Trial and Appeal Board (IPTAB) of the Korean Intellectual Property Office (KIPO) on Patent Cancellation Request of Korean Patent No. KR 2115531 (corresponding to U.S. Pat. No. 9,818,803) dated Mar. 16, 2021, 15 pages.
English translation of Petition for Patent Invalidation of Chinese Patent No. ZL201310035429.X (corresponding to U.S. Pat. No. 9,818,803) dated Dec. 22, 2020, 31 pages.

(56) References Cited

OTHER PUBLICATIONS

English translation of Petition for Patent Invalidation of Chinese Patent No. ZL201510595095.0 (corresponding to U.S. Pat. No. 9,818,803) dated Jan. 22, 2021, 26 pages.
U.S. Advisory Action from U.S. Appl. No. 13/614,197, dated Feb. 5, 2016, 3 pages.
U.S. Notice of Allowance from U.S. Appl. No. 14/059,356, dated Sep. 10, 2015, 5 pages.
U.S. Restriction Requirement from U.S. Appl. No. 13/614,197, dated Aug. 18, 2014, 7 pages.
U.S. Restriction Requirement from U.S. Appl. No. 16/505,536, dated Aug. 5, 2019, 7 pages.
Advisory Action for U.S. Appl. No. 13/614,197 dated May 18, 2015, 3 pages.
Advisory Action for U.S. Appl. No. 13/872,018 dated Nov. 14, 2016, 3 pages.
Advisory Action for U.S. Appl. No. 13/872,018 dated Dec. 8, 2015, 3 pages.
Advisory Action for U.S. Appl. No. 16/505,536 dated Apr. 7, 2021, 3 pages.
Ex Parte Quayle Action for U.S. Appl. No. 13/614,197 dated Jan. 5, 2017, 5 pages.
Ex Parte Quayle Action for U.S. Appl. No. 15/090,591 dated Aug. 5, 2016, 6 pages.
Final Office Action for U.S. Appl. No. 13/614,197 dated Dec. 2, 2015, 11 pages.
Final Office Action for U.S. Appl. No. 13/872,018 dated May 11, 2017, 16 pages.
Final Office Action for U.S. Appl. No. 13/872,018 dated Jun. 23, 2016, 12 pages.
Final Office Action for U.S. Appl. No. 13/872,018 dated Oct. 16, 2015, 15 pages.
Final Office Action for U.S. Appl. No. 14/059,356 dated Jun. 18, 2015, 15 pages.
Final Office Action for U.S. Appl. No. 15/811,599 dated Jan. 21, 2020, 18 pages.
Final Office Action for U.S. Appl. No. 16/505,536 dated Oct. 27, 2020, 15 pages.
Notice of Allowance for U.S. Appl. No. 13/614,197 dated Mar. 22, 2017, 7 pages.
Notice of Allowance for U.S. Appl. No. 13/614,197 dated Jul. 11, 2017, 7 pages.
Notice of Allowance for U.S. Appl. No. 13/872,018 dated Feb. 19, 2020, 5 pages.
Notice of Allowance for U.S. Appl. No. 13/872,018 dated May 28, 2020, 5 pages.
Notice of Allowance for U.S. Appl. No. 14/059,356 dated Apr. 27, 2016, 5 pages.
Notice of Allowance for U.S. Appl. No. 14/059,356 dated Nov. 25, 2015, 5 pages.
Notice of Allowance for U.S. Appl. No. 15/090,591 dated Feb. 13, 2017, 5 pages.
Notice of Allowance for U.S. Appl. No. 15/090,591 dated Jul. 31, 2017, 5 pages.
Notice of Allowance for U.S. Appl. No. 15/090,591 dated Dec. 9, 2016, 5 pages.
Notice of Allowance for U.S. Appl. No. 15/688,760 dated Jan. 30, 2019, 5 pages.
Notice of Allowance for U.S. Appl. No. 15/688,760 dated Sep. 14, 2018, 5 pages.
Notice of Allowance for U.S. Appl. No. 15/811,599 dated Feb. 14, 2019, 7 pages.
Notice of Allowance for U.S. Appl. No. 15/811,599 dated Mar. 31, 2020, 5 pages.
Notice of Allowance for U.S. Appl. No. 15/811,599 dated Jul. 10, 2020, 5 pages.
Notice of Allowance for U.S. Appl. No. 16/261,437 dated Jan. 10, 2020, 6 pages.
Notice of Allowance for U.S. Appl. No. 16/261,437 dated Apr. 27, 2020, 5 pages.
Notice of Allowance for U.S. Appl. No. 16/261,437 dated Aug. 14, 2020, 5 pages.
Notice of Allowance for U.S. Appl. No. 16/261,437 dated Dec. 28, 2020, 5 pages.
Office Action for U.S. Appl. No. 13/872,018 dated Feb. 29, 2016, 14 pages.
Office Action for U.S. Appl. No. 13/872,018 dated Jun. 30, 2015, 13 pages.
Office Action for U.S. Appl. No. 13/872,018 dated Dec. 30, 2016, 14 pages.
Patent Board Decision on Appeal for U.S. Appl. No. 13/872,018 dated Dec. 2, 2019, 8 pages.
Restriction Requirement for U.S. Appl. No. 13/872,018 dated Nov. 5, 2014, 8 pages.
Restriction Requirement for U.S. Appl. No. 15/811,599 dated Mar. 28, 2018, 7 pages.
U.S. Office Action from U.S. Appl. No. 16/505,536, dated May 11, 2022, 53 pages.
U.S. Final Office Action dated Nov. 24, 2021, issued in U.S. Appl. No. 16/505,536 (19 pages).
U.S. Office Action dated Oct. 21, 2020, issued in U.S. Appl. No. 16/882,384 (24 pages).
U.S. Office Action dated May 25, 2021, issued in U.S. Appl. No. 16/505,536 (15 pages).
U.S. Final Office Action dated Feb. 1, 2021, issued in U.S. Appl. No. 16/505,536 (8 pages).
U.S. Office Action dated Apr. 30, 2020, issued in U.S. Appl. No. 16/505,536 (14 pages).
U.S. Office Action dated Sep. 3, 2019, issued in U.S. Appl. No. 16/261,437 (11 pages).
U.S. Office Action dated Oct. 25, 2019, issued in U.S. Appl. No. 16/505,536 (14 pages).
Office action issued in U.S. Appl. No. 15/811,599 by the USPTO, dated Jul. 19, 2019, 19 pages.
U.S. Office Action dated Jul. 11, 2018, issued in U.S. Appl. No. 15/811,599 (19 pages).
U.S. Office Action dated Mar. 19, 2018, issued in U.S. Appl. No. 15/688,760 (13 pages).
EPO Communication Pursuant to Article 94(3) EPC, for Patent Application No. 13 178 648.5, mailed Jan. 31, 2019, 8 pages.
English Abstract of TW 2008-02221 A, also published as TW 1328207, listed above.
TIPO Office Action dated Oct. 11, 2016, for corresponding Taiwanese Patent Application No. 102124953 (6 pages).
U.S. Office Action dated Oct. 14, 2016 issued in cross-reference U.S. Appl. No. 13/614,197 (12 pages).
KIPO Office action dated Jul. 11, 2016, with English translation, for corresponding Korean Patent application 10-2016-0047800, (11 pages).
JPO Office action dated Feb. 16, 2016, corresponding to Japanese Patent application 2012-108855, (5 pages).
U.S. Office action dated Apr. 7, 2016, for U.S. Appl. No. 13/614,197, (13 pages).
EPO Search Report dated Jul. 8, 2013, for corresponding European Patent application 13157562.3, (6 pages).
Extended European Search Report dated Dec. 20, 2013, for corresponding European Patent Application No. 13178648.5 (9 pages).
Korean Patent Abstracts for Korean Publication 1020070055908 dated May 31, 2007, corresponding to Korean Patent 10-0742370 dated Jul. 24, 2007, listed above.
EPO Search Report dated Jul. 9, 2014, for European Patent application 14155124.2, (8 pages).
U.S. Office action dated Nov. 7, 2014, for cross reference U.S. Appl. No. 13/614,197, (16 pages).
U.S. Office action dated Aug. 29, 2014, for cross reference U.S. Appl. No. 14/059,356, (18 pages).
U.S. Office action dated Mar. 12, 2015, for cross reference U.S. Appl. No. 13/614,197, (13 pages).
SIPO Office action dated Mar. 11, 2015, corresponding to Chinese Patent application 201310035429.X, (7 pages).
Taiwan Office action dated Mar. 30, 2015, corresponding to Taiwanese Patent application 102101000, (7 pages).

(56) References Cited

OTHER PUBLICATIONS

Korean Patent Abstracts of Korean Publication No. 10-2003-0031207 A, published Apr. 21, 2003, which corresponds to KR 10-0807524 B1, 2 pages.
U.S. Office action dated Jul. 15, 2015, for cross reference U.S. Appl. No. 13/614,197, (11 pages).
U.S. Office action dated Dec. 2, 2015, for cross reference U.S. Appl. No. 13/614,197, (12 pages).
U.S. Office action dated Jul. 8, 2022, issued in U.S. Appl. No. 17/005,753 (48 pages).
U.S. Final Office action dated Nov. 24, 2021, issued in U.S. Appl. No. 17/005,753 (13 pages).
U.S. Office action dated Apr. 13, 2021, issued in U.S. Appl. No. 17/005,753 (22 pages).
U.S. Office action dated Sep. 2, 2016, issued in U.S. Appl. No. 13/872,018 (15 pages).
Certified English Translation of Murai et al., JP 4496852 B2, May 4, 2023 (16 pages).
Declaration of P. Morgan Pattison, Exhibit 1003 in Petition for Inter Partes Review for U.S. Pat. No. 9,818,803, Case No. IPR 2023-00987, dated Jun. 21, 2023 (128 pages).
Declaration of P. Morgan Pattison, Exhibit 1003 in Petition for Inter Partes Review for U.S. Pat. No. 10,854,683, Case No. IPR 2023-00988, dated Jun. 21, 2023 (126 pages).
Declaration of P. Morgan Pattison, Exhibit 1003 in Petition for Inter Partes Review for U.S. Pat. No. 11,594,578, Case No. IPR 2023-01075, dated Jun. 21, 2023 (128 pages).
Excerpt from Complainant's Opening Claim Construction Brief before the United States International Trade Commission, ITC Investigation No. 337-TA-1351, dated Jun. 13, 2023 (12 pages).
Explanation of Evidence in Petition to Invalidate JP Patent No. 6672194, dated Apr. 28, 2023 (2 pages).
Explanation of Evidence in Petition to Invalidate JP Patent No. 6748268, dated Apr. 28, 2023 (3 pages).
Galaxy S4 Images, attached to the Petition to Invalidate JP Patent No. 6748268, dated Apr. 28, 2023 (1 page).
Notice of Delivery of a Petition to Invalidate JP Patent No. 6672194, dated Jun. 27, 2023 (1 page).
Notice of Delivery of a Petition to Invalidate JP Patent No. 6748268, dated Jun. 27, 2023 (1 page).
Organic EL Book pages, Published 2015 (3 pages).
Petition for Inter Partes Review for U.S. Pat. No. 10,854,683, Case No. IPR 2023-00988, dated Jun. 21, 2023 (85 pages).
Patent Owner's Preliminary Response to Petition for Inter Partes Review for U.S. Pat. No. 10,854,683, Case No. IPR2023-00988, dated Oct. 16, 2023 (72 pages).
Petition for Inter Partes Review for U.S. Pat. No. 11,594,578, Case No. IPR 2023-01075, dated Jun. 21, 2023 (91 pages).
Patent Owner's Preliminary Response to Petition for Inter Partes Review for U.S. Pat. No. 11,594,578, Case No. IPR2023-01075, dated Oct. 12, 2023 (69 pages).
Petition for Inter Partes Review for U.S. Pat. No. 9,818,803, Case No. IPR 2023-00987, dated Jun. 21, 2023 (90 pages).
Patent Owner's Preliminary Response to Petition for Inter Partes Review for U.S. Pat. No. 9,818,803, Case No. IPR2023-00987, dated Oct. 10, 2023 (73 pages).
Petition to Invalidate JP Patent No. 6672194, dated Apr. 28, 2023 (39 pages).
Petition to Invalidate JP Patent No. 6748268, dated Apr. 28, 2023 (48 pages).
Samsung Galaxy S4 Product Information, attached to the Petition to Invalidate JP Patent No. 6748268, dated Apr. 28, 2023 (5 pages).
Samsung Galaxy S4 Product Listing, attached to the Petition to Invalidate JP Patent No. 6748268, dated Apr. 28, 2023 (7 pages).
Decision Granting Institution of Inter Partes Review Case No. IPR2023-01075 of U.S. Pat. No. 11,594,578 B2, dated Jan. 8, 2024, 49 pages.
Decision Granting Institution of Inter Partes Review Case No. IPR2023-00988 of U.S. Pat. No. 10,854,683 B2, dated Jan. 8, 2024, 49 pages.
Decision Granting Institution of Inter Partes Review Case No. IPR2023-00987 of U.S. Pat. No. 9,818,803 B2, dated Jan. 8, 2024, 54 pages.
U.S. Notice of Allowance dated Jun. 26, 2024, issued in U.S. Appl. No. 18/296,330 (5 pages).
U.S. Notice of Allowance dated Jul. 17, 2024, issued in U.S. Appl. No. 17/396,582 (5 pages).
U.S. Notice of Allowance dated Jul. 23, 2024, issued in U.S. Appl. No. 17/396,613 (5 pages).
Judgment Determining No Challenged Claim Unpatentable of Inter Partes Review Case No. IPR2023-01075 of U.S. Pat. No. 11,594,578 B2, dated Jan. 6, 2025, 34 pages.
Judgment Final Written Decision: Determining Some Challenged Claims Unpatentable Granting-in-Part Petitioner's First Motion to Strike Dismissing Petitioner's Second Motion to Strike Dismissing Petitioner's Motion to Exclude of Inter Partes Review Case No. IPR2023-00988 of U.S. Pat. No. 10,854,683 B2, dated Jan. 6, 2025, 103 pages.
Judgment Final Written Decision: Determining Some Challenged Claims Unpatentable Granting-in-Part Petitioner's First Motion to Strike Dismissing Petitioner's Second Motion to Strike Dismissing Petitioner's Motion to Exclude of Inter Partes Review Case No. IPR2023-00987 of U.S. Pat. No. 9,818,803 B2, dated Jan. 6, 2025, 124 pages.
Notice of Trial Decision, with English Machine Translation, dated Dec. 26, 2024 for Japanese Patent No. 6672194, corresponding to JP Patent Application 2017-22225, 175 pages.

PIXEL ARRANGEMENT STRUCTURE FOR ORGANIC LIGHT EMITTING DISPLAY DEVICE

CROSS-REFERENCE TO RELATED PATENT APPLICATIONS

This application is a continuation of U.S. patent application Ser. No. 18/175,351, filed Feb. 27, 2023, which is a continuation of U.S. patent application Ser. No. 16/505,536, filed Jul. 8, 2019, now U.S. Pat. No. 11,594,578, which is a continuation of U.S. patent application Ser. No. 15/811,599, filed Nov. 13, 2017, now U.S. Pat. No. 10,854,683, which is a continuation of U.S. patent application Ser. No. 13/614,197, filed Sep. 13, 2012, now U.S. Pat. No. 9,818,803, which claims priority to and the benefit of Korean Patent Application No. 10-2012-0022967, filed Mar. 6, 2012, the entire content of all of which is incorporated herein by reference.

BACKGROUND

1. Field

Aspects of embodiments of the present invention relate generally to a pixel arrangement structure of an organic light emitting diode (OLED) display.

2. Description of the Related Art

A display device is a device that displays an image. Recently, an OLED display has been drawing attention. The OLED display has a self-luminous characteristic. Because the OLED display does not need a separate light source, unlike a liquid crystal display, it can have a relatively smaller thickness and weight than liquid crystal displays. In addition, the OLED display exhibits high-quality characteristics such as low power consumption, high luminance, high response speed, etc.

In general, the OLED display includes a plurality of pixels for emitting light of different colors. The plurality of pixels emit light to display an image. Here, the pixel refers to a minimum unit for displaying the images. For instance, there may be a gate line, a data line, and a power line such as a driving power line to drive each pixel. In addition, there may be an insulation layer such as a pixel definition layer to define an area and a shape of each pixel. Further, each pixel may be positioned between its neighboring pixels.

An organic emission layer included in the pixel of an OLED display may be deposited and formed by using a mask such as a fine metal mask (FMM). When reducing a gap between the neighboring pixels to obtain a high aperture ratio of the pixel, deposition reliability may be deteriorated. On the other hand, when increasing the gap between the pixels to improve the deposition reliability, the aperture ratio of the pixel may be deteriorated.

The above information disclosed in this Background section is only for enhancement of understanding of the background of the invention. Therefore, it may contain information that does not form the prior art that is already known in this country to a person of ordinary skill in the art.

SUMMARY

Aspects of embodiments of the present invention relate generally to a pixel arrangement structure of an OLED display. More particularly, aspects relate to a pixel arrangement structure of an OLED display for displaying images by emitting light through a plurality of pixels. An exemplary embodiment of the present invention provides a pixel arrangement structure for an OLED display having an improved aperture ratio of a pixel while efficiently setting up a gap between the pixels.

According to an exemplary embodiment of the present invention, a pixel arrangement structure of an organic light emitting diode display is provided. The pixel arrangement structure includes: a first pixel having a center coinciding with a center of a virtual square; a second pixel separated from the first pixel and having a center at a first vertex of the virtual square; and a third pixel separated from the first pixel and the second pixel, and having a center at a second vertex neighboring the first vertex of the virtual square.

The second pixel may include a pair of second pixels. The second pixels may be separated from each other by the first pixel.

The third pixel may include a pair of third pixels. The third pixels may be separated from each other by the first pixel.

The second pixels and the third pixels may enclose the first pixel in the virtual square.

The first pixel, the second pixels, and the third pixels may have polygonal shapes. The second pixels and the third pixels may have a larger area than the first pixel.

The first pixel may have a quadrilateral shape. The second pixels and the third pixels may have hexagonal or octagonal shapes.

The second pixels and the third pixels may have octagonal shapes.

The second pixels and the third pixels may have a same area. A distance between the first pixel and the second pixels, a distance between the first pixel and the third pixels, and a distance between the second pixels and the third pixels may be a same first length.

The first pixel may include a plurality of first pixels. The plurality of first pixels may have a same quadrilateral shape. A distance between neighboring ones of the plurality of first pixels may be a second length that is longer than the first length.

The second pixels may have a larger area than the third pixels. A distance between the second pixels and the third pixels may be a first length. A distance between the first pixel and the second pixels, and a distance between the first pixel and the third pixels may be a same second length.

The first pixel may include a plurality of first pixels. The plurality of first pixels may have a same quadrilateral shape. A distance between neighboring ones of the plurality of first pixels may be a third length that is longer than the first length and the second length.

The first pixel may include a plurality of first pixels. Neighboring ones of the plurality of first pixels may have quadrilateral shapes that are symmetrical to each other. A distance between the neighboring ones of the plurality of first pixels may be a third length that is longer than the first length and the second length.

The first pixel may include a plurality of first pixels. Neighboring ones of the plurality of first pixels may have quadrilateral shapes that are symmetrical to each other.

The second pixels may have a larger area than the third pixels.

The third pixels may have a larger area than the second pixels.

The first pixel, the second pixel, and the third pixel may be configured to emit different color lights.

The first pixel, the second pixel, and the third pixel may be configured to emit green light, blue light, and red light, respectively.

According to an exemplary embodiment of the present invention, the pixel arrangement structure of the OLED display improves the aperture ratio of the pixel while efficiently setting up the gap between the pixels.

DETAILED DESCRIPTION

Figure 1:
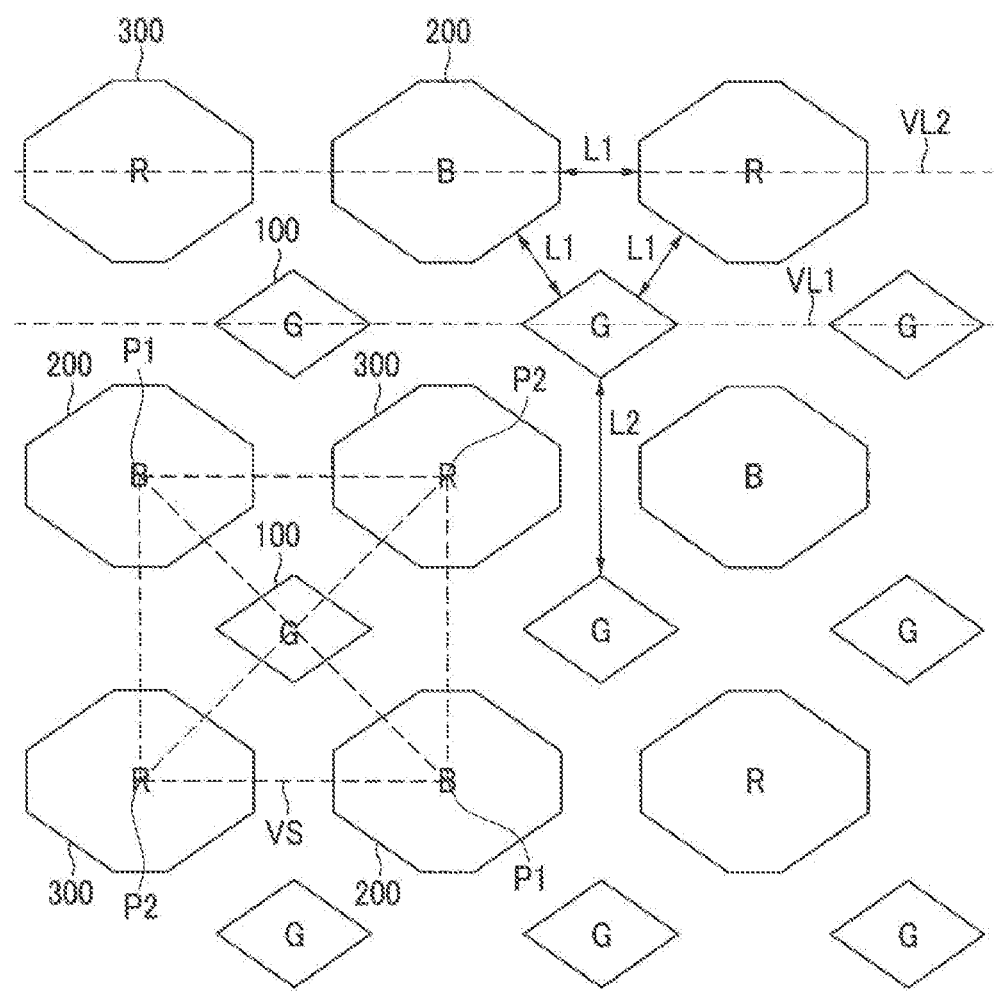
FIG. 1 is a view of a pixel arrangement structure of an OLED display according to a first exemplary embodiment.

Several exemplary embodiments according to the present invention are described hereinafter in detail with reference to the accompanying drawings to allow one of a person of ordinary skill in the art to practice the invention without undue experimentation. The present invention can be embodied in several different forms, and is not limited to exemplary embodiments that are described herein.

In order to clarify the description of embodiments of the present invention, parts that are not related to the embodiments may be omitted. In addition, the same elements or equivalents are referred to with the same reference numerals throughout the specification. For example, the same reference numerals are used for the elements having the same constructions throughout. Such elements are representatively described in a first exemplary embodiment, and in remaining exemplary embodiments, only different constructions from those of the first exemplary embodiment may be described.

Further, since sizes and thicknesses of constituent members shown in the accompanying drawings are arbitrarily given for better understanding and ease of description, the present invention is not limited to the illustrated sizes and thicknesses. In addition, unless explicitly described to the contrary, the word "comprise" and variations such as "comprises" or "comprising" will be understood to imply the inclusion of stated elements but not the exclusion of any other elements.

Nevertheless, even though each of the pixels are drawn as stereotypical polygonal shapes in the drawings, the present invention is not limited to this shape. That is, the shapes of the pixels may be modified to avoid interference with the other components of the OLED (e.g., wirings) within the spirit and scope of the appended claims.

A pixel arrangement structure (or pixel arrangement) of an OLED display according to a first exemplary embodiment will be described with reference to FIG. 1. FIG. 1 is a view schematically showing a portion of pixels forming an OLED display.

As shown in FIG. 1, the pixel arrangement structure of the OLED display includes a plurality of first pixels 100, a plurality of second pixels 200, and a plurality of third pixels 300. Here, the pixel refers to a minimum unit for displaying an image (for example, the minimum addressable unit of the display).

Further, among the first pixels 100, the second pixels 200, and the third pixels 300, power lines for driving each of the pixels, such as a gate line, a data line, a driving power line, and the like, may be located. In addition, an insulation layer, such as a pixel defining layer, for defining each of the pixels may be disposed. Finally, an OLED including an anode, an organic emission layer, and a cathode to correspond to each of the first pixels 100, the second pixels 200, and the third pixels 300 may be disposed. These configurations are technologies known in the art and further description thereof is omitted for ease of description. A shape of each of the pixels may be defined by the power lines, the pixel defining layer, the anode, or the like, but is not limited thereto.

In the pixel arrangement of FIG. 1, each of the first pixels 100 has a smaller area than neighboring second pixels 200 and third pixels 300, and has a quadrilateral (i.e., four-sided) shape among polygon shapes. For example, in the pixel arrangement of FIG. 1, each of the first pixels 100 has the same quadrilateral shape (e.g., a square or rhombus). The first pixels 100 are spaced apart from each other and arranged in rows, such as along a first virtual straight line VL1. The first pixels 100 emit green light, and may include an organic emission layer for emitting green light.

The second pixels 200 are arranged diagonally with respect to the first pixels 100, such as at first vertices P1 along one diagonal of a virtual square VS having one of the first pixels 100 as a center point (or center) of the virtual square VS. In a similar fashion, the third pixels 300 are arranged diagonally with respect to the first pixels 100, such as at second vertices P2 along the other diagonal of the virtual square VS.

In the virtual square VS, each of the second pixels 200 is separated from the first pixel 100, and is centered at one of the first vertices P1 of the virtual square VS. Each of the second pixels 200 has a larger area than the neighboring first pixel 100 and has an octagonal (i.e., eight-sided) shape. In FIG. 1, the second pixels 200 each have the same octagonal shape. In addition, the second pixels 200 are arranged diagonally and separated from each other by the first pixels 100. The second pixels 200 emit blue light, and may include an organic emission layer for emitting blue light.

In a similar fashion, in the virtual square VS, each of the third pixels 300 is separated from the first pixel 100 and the second pixels 200, and is centered at one of the second vertices P2 neighboring the first vertices P1 of the virtual square VS. Each of the third pixels 300 has a larger area than the neighboring first pixel 100 and the same area as each of the second pixels 200. Further, the third pixels have an octagonal shape (e.g., similar to or the same as the second pixels 200). In FIG. 1, the third pixels 300 each have the same octagonal shape. In addition, the third pixels 300 are arranged diagonally and separated from each other by the first pixels 100. The third pixels 300 emit red light, and may include an organic emission layer for emitting red light.

The third pixels 300 and the second pixels 200 are spaced apart from each other and alternately arranged in rows, such as along a second virtual straight line VL2. In a similar fashion, the third pixels 300 and the second pixels 200 are spaced apart from each other and alternately arranged in columns. Accordingly, in the virtual square VS, two of the second pixels 200 having their corresponding centers positioned at the first vertices P1 and two of the third pixels 300 having their corresponding centers positioned at the second vertices P2 to enclose a corresponding one of the first pixels 100 (e.g., in the virtual square VS).

As described above, the center of each of the second pixels 200 is positioned at one of the first vertices P1 of the virtual square VS. In addition, the center of the corresponding first pixel 100 is the center of the virtual square VS. Further, the center of each of the third pixels 300 is positioned at one of the second vertices P2. Moreover, the second pixels 200 and the third pixels 300 each have the same area.

As a non-limiting example, the distance (e.g., a shortest distance) between one of the first pixels 100 and an adjacent one of the second pixels 200 is a first length L1, the distance between one of the first pixels 100 and an adjacent one of the third pixels 300 is the same first length L1, and the distance between one of the second pixels 200 and an adjacent one of the third pixels 300 is the same first length L1, as shown in FIG. 1. In addition, the distance (e.g., a shortest distance) between the neighboring first pixels 100 is a second length L2 that is longer than the first length L1. It should be noted that L1, L2, L3, . . . may be used throughout to represent shortest distances between corresponding pixels.

Therefore, the gap of the first length L1 is formed between adjacent pairs of the first pixels 100 and the second pixels 200, between adjacent pairs of the first pixels 100 and the third pixels 300, and between adjacent pairs of the second pixels 200 and the third pixels 300. In addition, the gap of the second length L2 that is longer than the first length L1 is formed between the neighboring ones of the first pixels 100. This results in improved deposition reliability when using a fine metal mask to form the green, blue, and red organic emission layers respectively included in the first pixels 100, the second pixels 200, and the third pixels 300.

In addition, by enclosing each of the first pixels 100 by a pair of the second pixels 200 and a pair of the third pixels 300, the aperture ratio of the first pixels 100, the second pixels 200, and the third pixels 300 may be improved. Accordingly, a manufacturing time and manufacturing cost of the entire OLED display may be reduced and the display quality of the image of the OLED display may be improved.

As described above, in the pixel arrangement structure of the OLED display of FIG. 1, the first pixels 100, the second pixels 200, and the third pixels 300 have polygonal shapes (e.g., the first pixels have a quadrilateral shape and the second pixels 200 and the third pixels 300 have an octagonal shape). In addition, it is worth considering that the deposition process of the organic emission layer is one of the unique manufacturing characteristics of the OLED display. Accordingly, to improve the deposition reliability of the organic emission layer in the deposition process using the fine metal mask and to improve the aperture ratio of the first pixels 100, the second pixels 200, and the third pixels 300, the center of each of the first pixels 100 is positioned at the center of a virtual square VS formed by a first pair of diagonal vertices P1 and a second pair of diagonal vertices P2. In the virtual square VS, the centers of a pair of the second pixels 200 are positioned at the first vertices P1, and the centers of a pair of the third pixels 300 are positioned at the second vertices P2.

In addition, in the pixel arrangement structure of the OLED display of FIG. 1, the first pixels 100, the second pixels 200, and the third pixels 300 respectively emit green, blue, and red light. However, in pixel arrangement structures of other OLED displays, the first pixels 100, the second pixels 200, and the third pixels 300 may emit light of different colors. For example, at least one of the second pixels 200 or the third pixels may emit white light.

Next, a pixel arrangement structure of an OLED display according to a second exemplary embodiment will be described with reference to FIG. 2. Parts that are different from the exemplary embodiment of FIG. 1 will be described, while the description of parts that are equivalent to the first exemplary embodiment may be omitted. For better comprehension and ease of description, constituent elements of the second exemplary embodiment that are the same as or similar to those of the first embodiment of FIG. 1 will have the same reference numerals.

Figure 2:
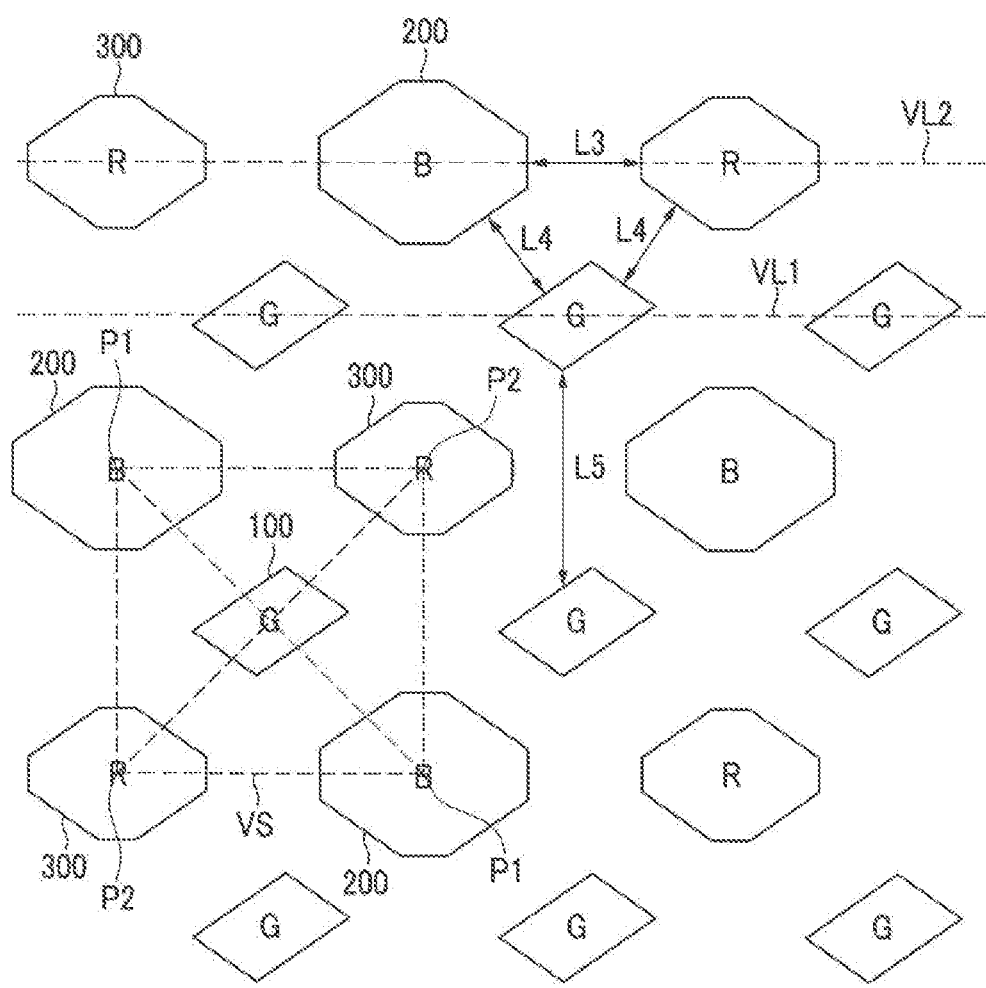
FIG. 2 is a view of a pixel arrangement structure of an OLED display according to a second exemplary embodiment.

As shown in FIG. 2, the pixel arrangement structure of the OLED display includes a plurality of first pixels 100, a plurality of second pixels 200, and a plurality of third pixels 300. The plurality of first pixels 100 have the same quadrilateral shape (e.g., a parallelogram). In addition, the second pixels 200 have a larger area than the third pixels 300. The second pixels 200 and the third pixels 300 may have polygonal shapes, such as octagonal or hexagonal (i.e., six-sided).

In a similar fashion to that of FIG. 1, the centers of a pair of the second pixels 200 are positioned at first vertices P1 along one diagonal of a virtual square VS having a center coinciding with a center of one of the first pixels 100. In addition, the centers of a pair of the third pixels 300 are positioned at second vertices P2 along another diagonal of the virtual square VS. However, in FIG. 2, the second pixels 200 have a larger area than the third pixels 300.

As a non-limiting example, the distance between adjacent ones of the second pixels 200 and the third pixels 300 is a third length L3, while the distance between each of the first pixels 100 and adjacent ones of the second pixels 200 or the third pixels 300 have a same fourth length L4. In addition, the distance between neighboring ones of the first pixels 100 is a fifth length L5 that is longer than the third length L3 and the fourth length L4.

Accordingly, the gap of the fourth length L4 is formed between adjacent pairs of the first pixels 100 and the second pixels 200, and between adjacent pairs of the first pixels 100 and the third pixels 300. In addition, the gap of the third length L3 is formed between adjacent pairs of the second pixels 200 and the third pixels 300. Further, the gap of the fifth length L5 that is longer than the third length L3 and the fourth length L4 is formed between the neighboring ones of the first pixels 100. This results in improved deposition reliability in the deposition process using the fine metal mask to form the green, blue, and red organic emission layers respectively included in the first pixels 100, the second pixels 200, and the third pixels 300.

In addition, by enclosing each of the first pixels 100 by a pair of the second pixels 200 and a pair of the third pixels 300, the aperture ratio of the first pixels 100, the second pixels 200, and the third pixels 300 may be improved. Accordingly, the manufacturing time and the manufacturing cost of the OLED display may be reduced and the display quality of the image of the OLED display may be improved.

Further, in the pixel arrangement structure of the OLED display of FIG. 2, the second pixels 200 that emit blue have the shortest life span among the first pixels 100, the second pixels 200, and the third pixels 300. Accordingly, the second pixels 200 have a larger area than the third pixels 300, thereby suppressing the deterioration of the life span of the OLED display. That is, the pixel arrangement structure of the OLED display of FIG. 2 provides improved life span.

Next, a pixel arrangement structure of an OLED display according to a third exemplary embodiment will be described with reference to FIG. 3. Parts that are different from the above exemplary embodiments will be described, while the description of parts that are equivalent to the above exemplary embodiments may be omitted. For better comprehension and ease of description, constituent elements of the third exemplary embodiment that are the same as or similar to the above exemplary embodiments will have the same reference numerals.

Figure 3:
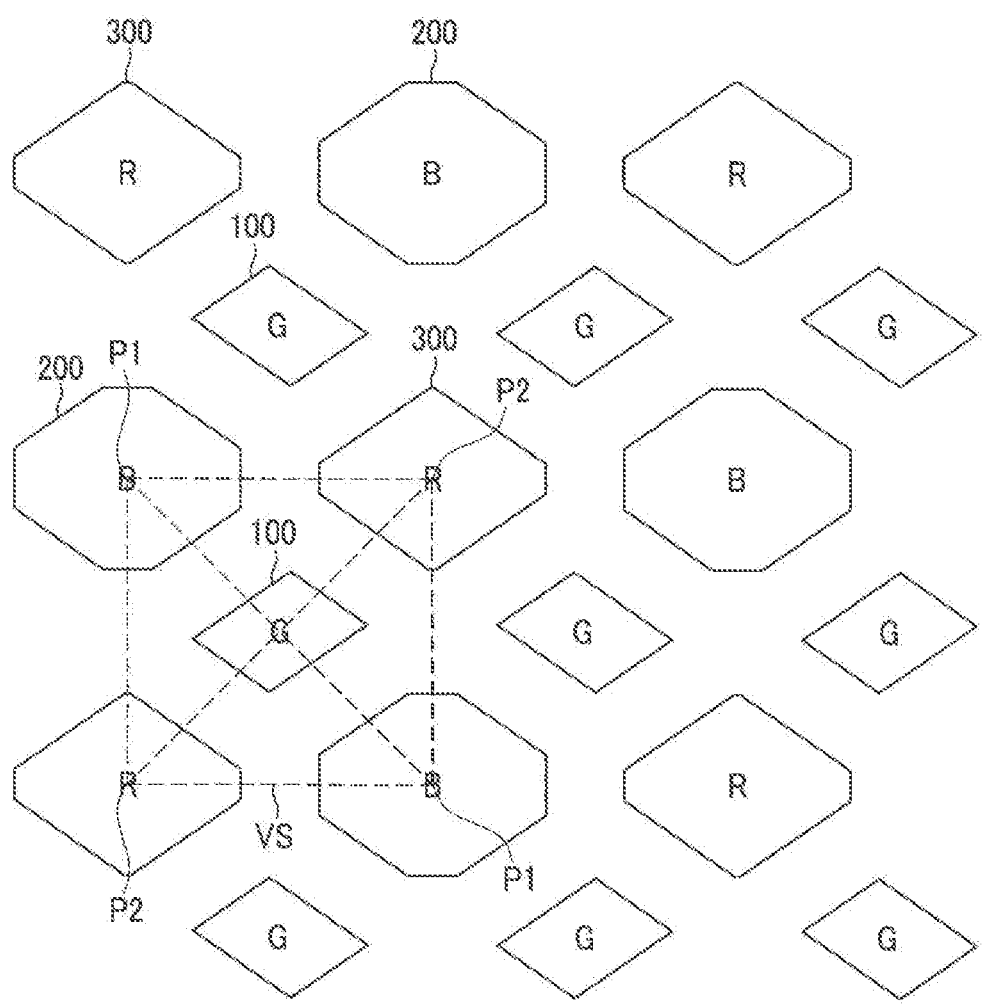
FIG. 3 is a view of a pixel arrangement structure of an OLED display according to a third exemplary embodiment.

As shown in FIG. 3, the pixel arrangement structure of the OLED display includes a plurality of first pixels 100, a plurality of second pixels 200, and a plurality of third pixels 300. Among the plurality of first pixels 100, the neighboring first pixels 100 have a quadrilateral shape (e.g., parallelogram) and are symmetrical to each other. In addition, the second pixels 200 have a larger area than the third pixels 300. The second pixels 200 and the third pixels may have polygonal shapes (e.g., hexagonal or octagonal).

In a similar fashion to that of FIGS. 1-2, the centers of a pair of the second pixels 200 are positioned at first vertices P1 along one diagonal of a virtual square VS having a center coinciding with a center of one of the first pixels 100. In addition, the centers of a pair of the third pixels 300 are positioned at second vertices P2 along another diagonal of the virtual square VS. However, in FIG. 3, the neighboring first pixels 100 have a quadrilateral shape and are symmetrical to each other, while the second pixels 200 have a larger area than the third pixels 300. This results in improved deposition reliability in the deposition process using the fine metal mask to form the green, blue, and red organic emission layers respectively included in the first pixels 100, the second pixels 200, and the third pixels 300.

In addition, by placing each of the first pixels 100 between a pair of the second pixels 200 and between a pair of the third pixels 300, the aperture ratio of the first pixels 100, the second pixels 200, and the third pixels 300 may be improved. Accordingly, the manufacturing time and the manufacturing cost of the OLED display may be reduced and the display quality of the image of the OLED display may be improved.

Further, in the pixel arrangement structure of the OLED display of FIG. 3, the second pixels 200 that emit blue have the shortest life span among the first pixels 100, the second pixels 200, and the third pixels 300. Accordingly, the second pixels 200 have a larger area than the third pixels 300, thereby suppressing the deterioration of the life span of the OLED display. That is, the pixel arrangement structure of the OLED display provides improved life span.

Next, a pixel arrangement structure of an OLED display according to a fourth exemplary embodiment will be described with reference to FIG. 4. Parts that are different from the above exemplary embodiments will be described, while the description of parts that are equivalent to the above exemplary embodiments may be omitted. For better comprehension and ease of description, constituent elements of the fourth exemplary embodiment that are the same as or similar to the above exemplary embodiments will have the same reference numerals.

Figure 4:
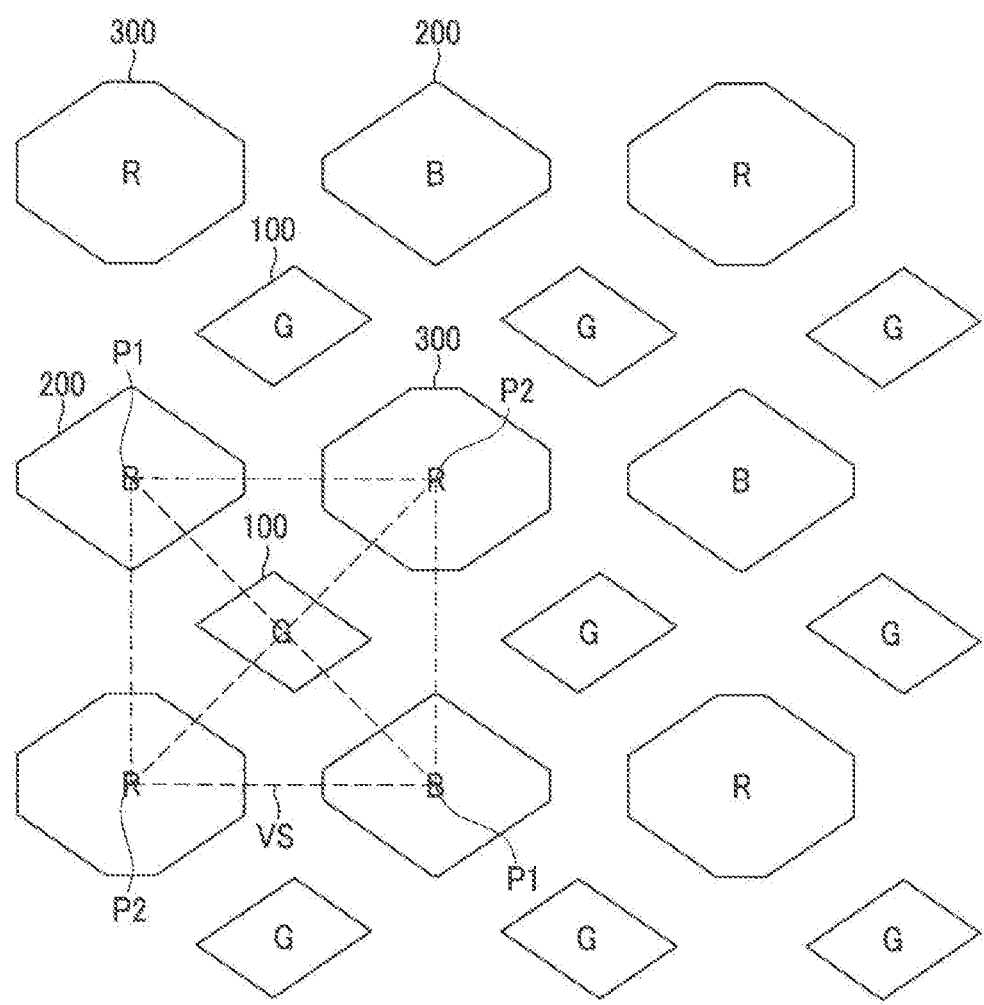
FIG. 4 is a view of a pixel arrangement structure of an OLED display according to a fourth exemplary embodiment.

As shown in FIG. 4, the pixel arrangement structure of the OLED display includes a plurality of first pixels 100, a plurality of second pixels 200, and a plurality of third pixels 300. Among the plurality of first pixels 100, the neighboring first pixels 100 have a quadrilateral shape (e.g., parallelogram) and are symmetrical to each other. In addition, the third pixels 300 have a larger area than the second pixels 200. The second pixels 200 and the third pixels may have polygonal shapes (e.g., hexagonal or octagonal).

In a similar fashion to that of FIGS. 1-3, the centers of a pair of the second pixels 200 are positioned at the first vertices P1 along one diagonal of a virtual square VS having a center coinciding with a center of one of the first pixels 100. In addition, the centers of a pair of the third pixels 300 are positioned at second vertices P2 along another diagonal of the virtual square VS. However, in FIG. 4, the neighboring first pixels 100 have a quadrilateral shape and are symmetrical to each other, while the third pixels 300 have a larger area than the second pixels 200. This results in improved deposition reliability in the deposition process using the fine metal mask to form the green, blue, and red organic emission layers respectively included in the first pixels 100, the second pixels 200, and the third pixels 300.

In addition, by enclosing each of the first pixels 100 by a pair of the second pixels 200 and a pair of the third pixels 300, the aperture ratio of the first pixels 100, the second pixels 200, and the third pixels 300 may be improved. Accordingly, the manufacturing time and the manufacturing cost of the OLED display may be reduced and the display quality of the image of the OLED display may be improved.

Next, a pixel arrangement structure of an OLED display according to a fifth exemplary embodiment will be described with reference to FIG. 5. Parts that are different from the above exemplary embodiments will be described, while the description of parts that are equivalent to the above exemplary embodiments may be omitted. For better comprehension and ease of description, constituent elements of the fifth exemplary embodiment that are the same as or similar to the above exemplary embodiments will have the same reference numerals.

Figure 5:
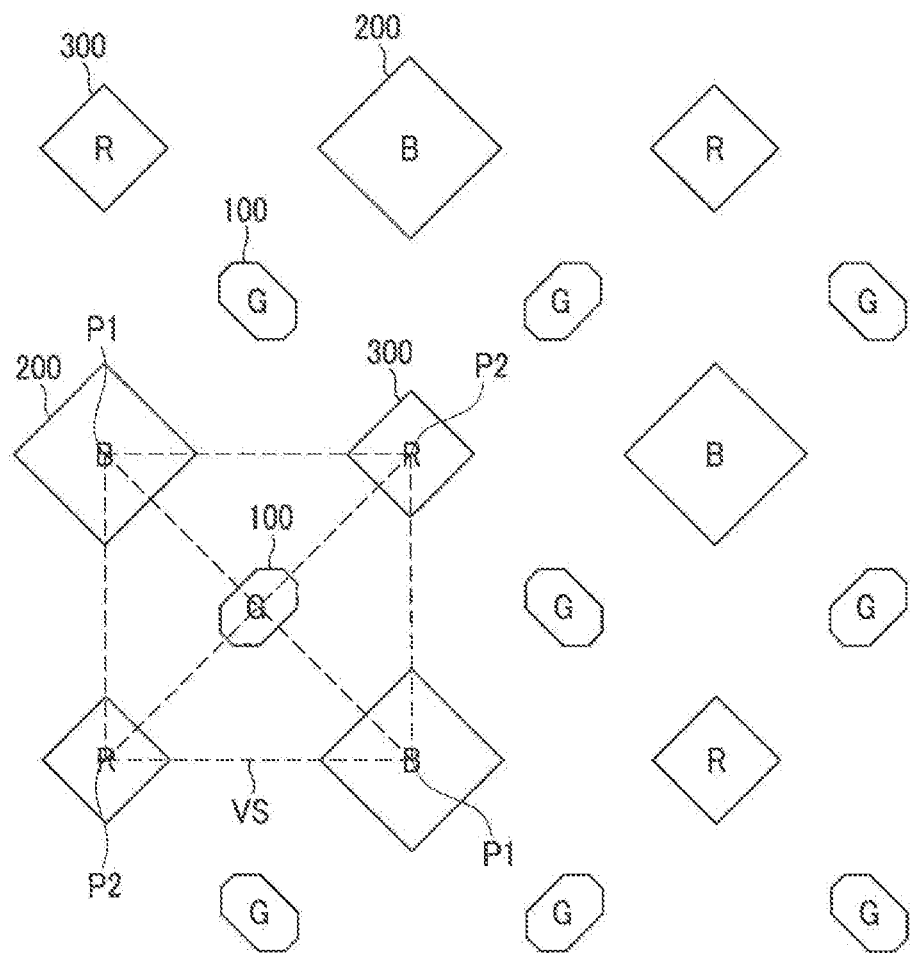
FIG. 5 is a view of a pixel arrangement structure of an OLED display according to a fifth exemplary embodiment.

As shown in FIG. 5, the pixel arrangement structure of the OLED display includes a plurality of first pixels 100, a plurality of second pixels 200, and a plurality of third pixels 300. Among the plurality of first pixels 100, the neighboring first pixels 100 have a octagonal shape and are symmetrical to each other. In addition, the second pixels 200 have a larger area than the third pixels 300. The second pixels 200 and the third pixels 300 may have quadrilateral shapes (e.g., rhombus).

In a similar fashion to that of FIGS. 1-3, the centers of a pair of the second pixels 200 are positioned at the first vertices P1 along one diagonal of a virtual square VS having a center coinciding with a center of one of the first pixels 100. In addition, the centers of a pair of the third pixels 300 are positioned at second vertices P2 along another diagonal of the virtual square VS. However, in FIG. 5, the neighboring first pixels 100 have a octagonal shape and are symmetrical to each other, while the second pixels 200 have a larger area than the third pixels 300. This results in improved deposition reliability in the deposition process using the fine metal mask to form the green, blue, and red organic emission layers respectively included in the first pixels 100, the second pixels 200, and the third pixels 300.

In addition, by enclosing each of the first pixels 100 by a pair of the second pixels 200 and a pair of the third pixels 300, the aperture ratio of the first pixels 100, the second pixels 200, and the third pixels 300 may be improved. Accordingly, the manufacturing time and the manufacturing cost of the OLED display may be reduced and the display quality of the image of the OLED display may be improved.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims, and equivalents thereof.

DESCRIPTION OF SOME SYMBOLS first pixels 100, second pixels 200, third pixels 300

What is claimed is:

1. An organic light emitting diode (OLED) display, comprising a plurality of individually addressable pixels for displaying an image, the plurality of individually addressable pixels being minimum addressable units of the OLED display and comprising:
   a plurality of first pixels comprising an organic emission layer for emitting light having a first color;
   a second pixel comprising an organic emission layer for emitting light having a second color and surrounded by four of the plurality of first pixels located at respective vertexes of a first virtual square; and
   a third pixel comprising an organic emission layer for emitting light having a third color and surrounded by four of the plurality of first pixels located at respective vertexes of a second virtual square,
   wherein the plurality of first pixels, the second pixel, and the third pixel are spaced apart from one another,
   wherein the first and second virtual squares share a common side having endpoints at a common first vertex and a common second vertex of the first and second virtual squares, the common first vertex and the common second vertex overlapping an adjacent pair of the plurality of first pixels,
   wherein a shortest distance between one pixel of the adjacent pair of the plurality of first pixels and the second pixel is a first length that is smaller than a shortest distance between the adjacent pair of the plurality of first pixels,
   wherein a shortest distance between the one pixel of the adjacent pair of the plurality of first pixels and the third pixel is a second length that is smaller than the shortest distance between the adjacent pair of the plurality of first pixels,
   wherein the second pixel has an area that is larger than that of the third pixel,
   wherein a longest width of the one pixel of the adjacent pair of the plurality of first pixels measured along a first virtual line parallel to a diagonal of the first virtual square is different from a longest width of another pixel of the adjacent pair of the plurality of first pixels measured along a second virtual line that is parallel to the first virtual line and offset from the first virtual line, and
   wherein the one pixel of the adjacent pair of the plurality of first pixels and the another pixel of the adjacent pair of the plurality of first pixels are mirror symmetric with each other with respect to a third virtual line crossing the first virtual line.

2. The OLED display of claim 1, wherein two of the four of the plurality of first pixels surrounding the second pixel are symmetric with each other with respect to the diagonal of the first virtual square, and another two of the four of the plurality of first pixels surrounding the second pixel are symmetric with each other with respect to another diagonal of the first virtual square.

3. The OLED display of claim 1, wherein two of the four of the plurality of first pixels surrounding the second pixel are symmetric with each other with respect to the second pixel, and another two of the four of the plurality of first pixels surrounding the second pixel are symmetric with each other with respect to the second pixel.

4. The OLED display of claim 1, wherein two of the four of the plurality of first pixels surrounding the third pixel are symmetric with each other with respect to the third pixel, and another two of the four of the plurality of first pixels surrounding the third pixel are symmetric with each other with respect to the third pixel.

5. The OLED display of claim 1, wherein each of the plurality of first pixels has a short axis and a long axis perpendicular to the short axis, each of the short axis and the long axis bisecting the first pixel in two equal and symmetric portions, and
   wherein the short axis of each of the four of the plurality of first pixels surrounding the second pixel is aligned with the diagonal or another diagonal of the first virtual square.

6. The OLED display of claim 1, wherein each of the plurality of first pixels has a short axis and a long axis perpendicular to the short axis, each of the short axis and the long axis bisecting the first pixel in two equal and symmetric portions, and
   wherein the long axis of each of the four of the plurality of first pixels surrounding the third pixel is aligned with a diagonal or another diagonal of the second virtual square.

7. The OLED display of claim 1, wherein centers of the four of the plurality of first pixels surrounding the second pixel respectively coincide with vertexes of the first virtual square, and centers of the four of the plurality of first pixels surrounding the third pixel respectively coincide with vertexes of the second virtual square.

8. The OLED display of claim 1, wherein the common first vertex and the common second vertex coincide with centers of the adjacent pair of the plurality of first pixels.

9. A display comprising:
   a plurality of first pixel rows, each of the first pixel rows comprising a plurality of first pixels arranged along a first direction; and
   a plurality of second pixel rows alternately arranged with the first pixel rows along a second direction crossing the first direction,
   each of the second pixel rows comprising a plurality of second pixels and a plurality of third pixels that are alternately arranged along the first direction,
   each pixel of the plurality of first pixels, the plurality of second pixels, and the plurality of third pixels being an individually addressable pixel, which is a minimum addressable unit of the display,
   wherein the plurality of first pixels, the plurality of second pixels, and the plurality of third pixels are spaced apart from one another,
   wherein the first pixels are arranged along a corresponding one of the first pixel rows,
   wherein the second pixels and the third pixels are arranged along a corresponding one of the second pixel rows,
   wherein one of the second pixels and one of the third pixels adjacent to the one of the second pixels in each of two adjacent ones of the second pixel rows form a first virtual quadrangle,
   wherein a first one of the first pixels is located in the first virtual quadrangle,
   wherein the one of the second pixels of a first one of the two adjacent ones of the second pixel rows and the one of the third pixels of a second one of the two adjacent ones of the second pixel rows form a side of a second virtual quadrangle,
   wherein a second one of the first pixels is located in the second virtual quadrangle, wherein a shortest distance between two nearest first pixels from among the pluralities of first pixels of the plurality of first pixel rows is greater than a shortest distance between one second pixel from among the pluralities of second pixels of the plurality of second pixel rows and one third pixel that is from among the pluralities of third pixels of the plurality of second pixel rows and that is nearest to the one second pixel, wherein the first one of the first pixels is mirror symmetric with respect to at least one of a first diagonal or a second diagonal of the first virtual quadrangle, and wherein the second one of the first pixels is mirror symmetric with respect to at least one of a first diagonal or a second diagonal of the second virtual quadrangle.

10. The display of claim 9, wherein centers of the first pixels are aligned along the corresponding one of the first pixel rows.

11. The display of claim 9, wherein centers of the second pixels and centers of the third pixels are aligned along the corresponding one of the second pixel rows.

12. The display of claim 9, wherein the first one of the first pixels is located at a center of the first virtual quadrangle, and the second one of the first pixels is located at a center of the second virtual quadrangle.

13. The display of claim 9, wherein the ones of the second pixels and the ones of the third pixels in the two adjacent ones of the second pixels row overlap with respective vertexes of the first virtual quadrangle.

14. A display comprising:
a plurality of first pixel rows, each of the first pixel rows comprising a plurality of first pixels arranged along a first direction;
a plurality of second pixel rows alternately arranged with the plurality of first pixel rows along a second direction crossing the first direction,
each of the second pixel rows comprising a plurality of second pixels and a plurality of third pixels that are alternately arranged along the first direction,
each pixel of the plurality of first pixels, the plurality of second pixels, and the plurality of third pixels being an individually addressable pixel, which is a minimum addressable unit of the display;
wherein the plurality of first pixels, the plurality of second pixels, and the plurality of third pixels are spaced apart from one another,
a plurality of first pixel groups, each of the first pixel groups comprising a first one of the first pixels and one of the second pixels neighboring the first one of the first pixels; and
a plurality of second pixel groups, each of the second pixel groups comprising a second one of the first pixels and one of the third pixels neighboring the second one of the first pixels,
wherein each of the first pixel groups extend in a same direction as and is parallel to an adjacent one of the second pixel groups,
wherein the first pixel groups and the second pixel groups are alternately arranged along the first direction,
wherein a shortest distance between two nearest ones of the first pixels in the second direction is greater than a width in the second direction of at least one of the second pixels or the third pixels,
wherein a shortest distance between two nearest ones of the first pixels in one of the first pixel rows is greater than a shortest distance between one of the second pixels and one of the third pixels that are nearest each other in one of the second pixel rows, and wherein one of the plurality of first pixels has a convex shape with no vertex angle of 90 degrees.

15. The display of claim 14, wherein each of the plurality of first pixels comprises a center portion and end portions between the center portion and respective ends, and
wherein a width of the end portions in each of the plurality of first pixels gradually decreases from the center portion towards the respective ends.

16. The display of claim 15, wherein the end portions of each of the plurality of first pixels are symmetric to each other with respect to the center portion between the end portions.

17. A display comprising a plurality of pixels for displaying an image,
the plurality of pixels comprising:
a plurality of first pixels to produce light of a first color;
a plurality of second pixels to produce light of a second color different from the first color; and
a plurality of third pixels to produce light of a third color different from the first color and the second color,
each pixel of the plurality of first pixels, the plurality of second pixels, and the plurality of third pixels being an individually addressable pixel, which is a minimum addressable unit of the display,
wherein the plurality of first pixels, the plurality of second pixels, and the plurality of third pixels are spaced apart from one another,
wherein the plurality of pixels are organized into a plurality of first pixel rows and a plurality of second pixel rows that are alternately arranged along a column direction,
wherein each of the first pixel rows consists of some of the first pixels and some of the second pixels that are alternately arranged along a row direction perpendicular to the column direction,
wherein each of the second pixel rows consists of some of the first pixels and some of the third pixels that are alternately arranged along the row direction,
wherein a shortest distance between two nearest first pixels from among the plurality of first pixels is greater than a shortest distance between one second pixel from among the plurality of second pixels and one third pixel that is from among the plurality of third pixels and that is nearest to the one second pixel, and
wherein in each of the first pixel rows, two first pixels of the plurality of first pixels are symmetric with respect to one of the plurality of second pixels located between and immediately adjacent to the two first pixels.

18. A pixel arrangement structure of a display comprising:
a plurality of pixels comprising a plurality of first pixels, a plurality of second pixels, and a plurality of third pixels, each pixel of the plurality of first pixels, the plurality of second pixels, and the plurality of third pixels being an individually addressable pixel, which is a minimum addressable unit of the display,
wherein the plurality of first pixels, the plurality of second pixels, and the plurality of third pixels are spaced apart from one another,
wherein each of two first pixels of the plurality of first pixels comprises a center portion and end portions between the center portion and respective ends, a width of the end portions in each of the two first pixels gradually decreasing from the center portion towards the respective ends,
wherein the two first pixels are aligned with each other along a first direction, wherein one of the two first pixels is elongated in a second direction and an other one of the two first pixels is elongated in a third direction crossing the second direction, wherein each of two second pixels of the plurality of second pixels comprises two pairs of sides that are generally parallel to the second and third directions, respectively, wherein the two second pixels are aligned with each other along the second direction, wherein each of two third pixels of the plurality of third pixels comprises two pairs of sides that are generally parallel to the second and third directions, respectively, wherein the two third pixels are aligned with each other along the third direction, and wherein the end portions of each of the two first pixels are symmetric with each other with respect to the center portion between the end portions.

19. The pixel arrangement structure of claim 18, wherein a virtual line extending in the second direction and bisecting the end portions of the one of the two first pixels passes through a center of the one of the two first pixels.

20. A pixel arrangement structure comprising a plurality of pixels for displaying an image on a display, the plurality of pixels comprising a plurality of first pixels, a plurality of second pixels, and a plurality of third pixels, each pixel of the plurality of first pixels, the plurality of second pixels, and the plurality of third pixels being an individually addressable pixel, which is a minimum addressable unit of the display, wherein the plurality of first pixels, the plurality of second pixels, and the plurality of third pixels are spaced apart from one another, wherein a first virtual square having vertexes respectively overlapping with four of the first pixels and a second virtual square having vertexes respectively overlapping with four of the first pixels are adjacent to one another along a first direction, wherein the first virtual square and the second virtual square share two common vertexes at which two of the first pixels are located, wherein the first virtual square and the second virtual square have a same size that is a smallest size whereby, while the first virtual square and the second virtual square share the two common vertexes, the first virtual square touches the four of the first pixels that respectively overlap with the vertexes of the first virtual square and the second virtual square touches the four of the first pixels that respectively overlap with the vertexes of the second virtual square, wherein the first virtual square completely surrounds one of the second pixels, and the second virtual square completely surrounds one of the third pixels, and wherein the two of the first pixels are mirror symmetric with respect to a virtual line that passes through a center of the first virtual square and a center of the second virtual square.

21. The pixel arrangement structure of claim 20, wherein directly facing sides of two adjacent ones of the first pixels have substantially the same shape and substantially the same length as each other.

22. The pixel arrangement structure of claim 20, wherein directly facing sides of two adjacent ones of the first pixels are mirror symmetric with each other with respect to the virtual line.

23. The pixel arrangement structure of claim 20, wherein directly facing sides of two adjacent ones of the first pixels along the first direction completely overlap with each other in the first direction.

24. The pixel arrangement structure of claim 23, wherein no portion of any of the plurality of the third pixels is interposed between the directly facing sides of the two adjacent ones of the first pixels along the first direction.

25. The pixel arrangement structure of claim 23, wherein directly facing sides of two adjacent ones of the first pixels along a second direction perpendicular to the first direction completely overlap with each other in the second direction.

26. The pixel arrangement structure of claim 25, wherein no portion of any of the plurality of the third pixels is interposed between the directly facing sides of the two adjacent ones of the first pixels along the second direction.

* * * * *